United States Patent
Lapicki et al.

(10) Patent No.: US 10,186,285 B2
(45) Date of Patent: Jan. 22, 2019

(54) DATA READER WITH FRONT SHIELD COUPLING STRUCTURE

(71) Applicant: Seagate Technology, LLC, Cupertino, CA (US)

(72) Inventors: Adam A. Lapicki, Derry (GB); Sameh Hassan, Londonderry (GB); YuQing Du, Londonderry (GB); Mark T. Kief, Lakeville, MN (US); Marcus W. Ormston, Derry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/492,638

(22) Filed: Apr. 20, 2017

(65) Prior Publication Data

US 2017/0221510 A1 Aug. 3, 2017

Related U.S. Application Data

(63) Continuation of application No. 14/810,164, filed on Jul. 27, 2015, now Pat. No. 9,634,242.

(51) Int. Cl.
| | |
|---|---|
| *H01L 43/08* | (2006.01) |
| *G11B 5/39* | (2006.01) |
| *G01R 33/00* | (2006.01) |
| *G01R 33/09* | (2006.01) |

(52) U.S. Cl.
CPC ........ *G11B 5/3912* (2013.01); *G01R 33/0011* (2013.01); *G01R 33/0017* (2013.01); *G01R 33/0076* (2013.01); *G01R 33/093* (2013.01); *G11B 5/398* (2013.01); *G11B 5/3932* (2013.01); *H01L 43/08* (2013.01)

(58) Field of Classification Search
CPC ....... H01L 27/22; H01L 27/222; H01L 43/00; H01L 43/04; H01L 43/08
See application file for complete search history.

(56) References Cited

U.S. PATENT DOCUMENTS

| | | | |
|---|---|---|---|
| 8,395,867 B2 | 3/2013 | Dimitrov et al. | |
| 8,582,249 B2 | 11/2013 | Sapozhnikov et al. | |
| 8,711,528 B1 | 4/2014 | Xiao et al. | |
| 8,760,820 B1 * | 6/2014 | McKinlay | G11B 5/3912 360/319 |
| 8,780,505 B1 * | 7/2014 | Xiao | G11B 5/3909 360/319 |
| 9,001,473 B1 | 4/2015 | Gao et al. | |
| 9,007,729 B1 | 4/2015 | Ho et al. | |
| 9,202,492 B2 | 12/2015 | Le et al. | |
| 9,412,401 B2 | 8/2016 | Du et al. | |
| 2013/0286509 A1 | 10/2013 | Sahoo et al. | |
| 2015/0179195 A1 | 6/2015 | Freitag et al. | |

* cited by examiner

*Primary Examiner* — Cuong Q Nguyen
(74) *Attorney, Agent, or Firm* — Hall Estill Attorneys at Law

(57) ABSTRACT

A data reader may consist of at least a magnetoresistive stack positioned on an air bearing surface. A portion of the magnetoresistive stack may be set to a first fixed magnetization by a pinning structure separated from the air bearing surface by a front shield that is set to a second fixed magnetization by a biasing structure. The front shield may be separated from the biasing structure by a coupling structure.

20 Claims, 4 Drawing Sheets

DATA READER WITH FRONT SHIELD COUPLING STRUCTURE

RELATED APPLICATION

The present application is a continuation of co-pending U.S. patent application Ser. No. 14/810,164 filed Jul. 27, 2015, which issues as U.S. Pat. No. 9,634,242 on Apr. 25, 2017.

SUMMARY

A data reader, in accordance with assorted embodiments, has a magnetoresistive stack positioned on an air bearing surface with a portion of the magnetoresistive stack set to a first fixed magnetization by a pinning structure separated from the air bearing surface by a front shield. A biasing structure sets the front shield to a second fixed magnetization that differs from the first fixed magnetization. A coupling structure separates the front shield from the biasing structure.

DETAILED DESCRIPTION

In accordance with the continued goal of increasing data storage capacity in data storage devices, data access components, such as data readers and data writers, have reduced magnetic and physical sizes. By recessing a portion of a data reader from an air bearing surface (ABS), the practical size of a data reader can be decreased. However, recessing portions of a data reader can induce magnetic volatility in shields that separate the recessed portions from the ABS. Thus, various embodiments are directed to stabilizing portions of a data reader employing a recessed magnetic portion.

In a non-limiting example, a data reader is configured with a magnetoresistive (MR) stack positioned on an air bearing surface and a portion of the MR stack is set to a first fixed magnetization by a pinning structure separated from the air bearing surface by a front shield that is set to a second fixed magnetization by a biasing structure separated from the front shield by a coupling structure. Currently, there is no adequate integration scheme proven to produce a seamless interface between front and core portions of a shield that are constructed of similar materials, such as NiFe in permalloy compositions. That is, residue from the recessed pinning structure can remain beneath the front shield, which can result in magnetic instability in the front shield due to a lack of consistent coupling between the front and core portions of a reader shield.

The ability to tune the materials, position, size, and number of constituent sub-layers allows the coupling structure to provide consistent coupling between the front and core portions of a shield despite a reduced physical size of the data reader on the ABS. Such consistent coupling can optimize data reader performance by decreasing the magnetic extent of the MR stack while allowing the recessed pinning structure to set a reference magnetization in the MR stack.

Figure 1:
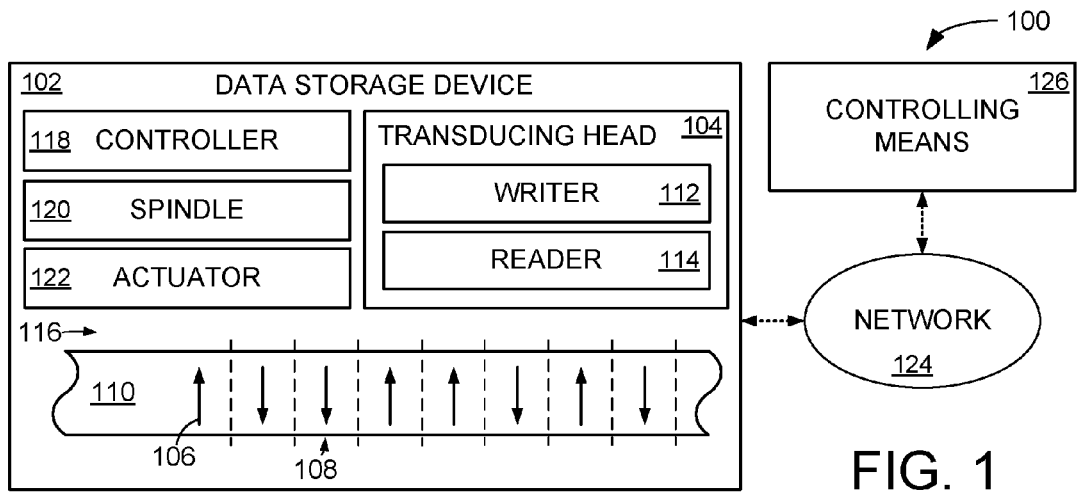
FIG. 1 is a block representation of an example data storage system configured and operated in accordance with some embodiments.

While a data reader employing a recessed pinning structure can be utilized in an unlimited variety of environments and systems, FIG. 1 provides an example data storage system 100 in which a tuned data reader can be commissioned in accordance with some embodiments. Although not required or limiting, the data storage system 100 can have one or more data storage devices 102 that are configured with at least one data storage means. It is contemplated that various solid-state volatile and non-volatile memories can be used in a hybrid data storage device.

Assorted embodiments arrange at least one data storage means of the data storage system 100 as a hard disk drive with at least one transducing head 104 accessing data bits 106 stored in patterned data tracks 108 on a data storage medium 110. The transducing head 104 can utilize one or more data writers 112 and data readers 114 to access the data bits 106 to store and/or read data from the data storage medium 110 across an air bearing 116. At least one local controller 118, such as a microprocessor, can control the size of the air bearing 116 on which the transducing head 104 floats and the position of the transducing head 104 by concurrently or successively manipulating the spindle motor 120 of the data storage medium 110 and an actuator 122 portion of the data storage device 102.

The controller 118 can be connected to the various aspects of the data storage system 100, as shown, to monitor, detect, and control the data storage environment to provide data access operations. At least one controller 118 can be local and incorporated into the data storage device 102 and one or more controllers 118 can be remote and connected to the data storage device 102 via wired or wireless networks 124. Connection to at least one network 124 allows the local controller 118 to be utilized individually or collectively with other controlling means 126, such as processors, servers, hosts, and nodes, which are not physically located in or on the data storage device 102.

Figure 2:
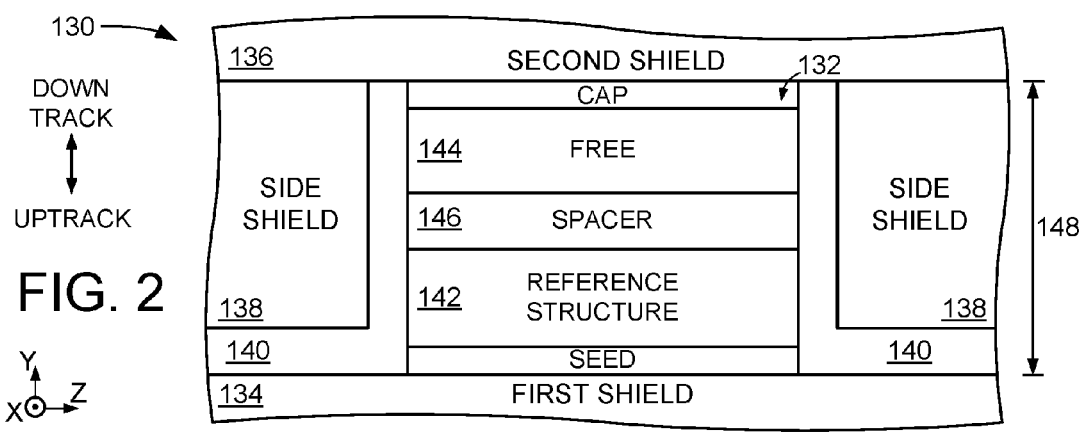
FIG. 2 displays a line representation of a portion of an example data reader capable of being used with the data storage system of FIG. 1.

To increase the data storage capacity of the data storage device 102, the data bits 106 are positioned closer together in data tracks 108 with reduced widths. Such increase in data density causes a data reader to have a reduced magnetic extent to allow the sensing of individual data bits 106. FIG. 2 displays a line representation of a portion of an example data reader 130 that may be employed in the data storage system 100 of FIG. 1 to sense data arranged in high data density environments. The data reader 130 has a magnetoresistive stack 132 disposed between first 134 and second 136 shields as well as between side shields 138.

The magnetoresistive stack 132 can be separated from the side shields 138 by lateral nonmagnetic layers 140 and separated from the first 134 and second 136 shields by conductive cap and seed electrode layers, respectively. The magnetoresistive stack 132 may be configured in a variety of different manners to sense data from an adjacent data storage medium. For example, the magnetoresistive stack 132 may be a spin valve, trilayer lamination without a fixed magnetization, or a lateral spin valve with a fixed magnetization structure 142 separated from a magnetically free structure 144 by a spacer structure 146, as shown.

Decreasing the shield-to-shield spacing (SSS) 148 of the data reader 130 can increase data bit linear resolution, but can correspond with increased magnetic and thermal volatility that results in degraded performance. In other words, a small SSS 148 can decrease the magnetic extent of the data reader 130, but can also increase the risk of inadvertent magnetic behavior that can jeopardize the accuracy of data bit sensing.

Figure 3:
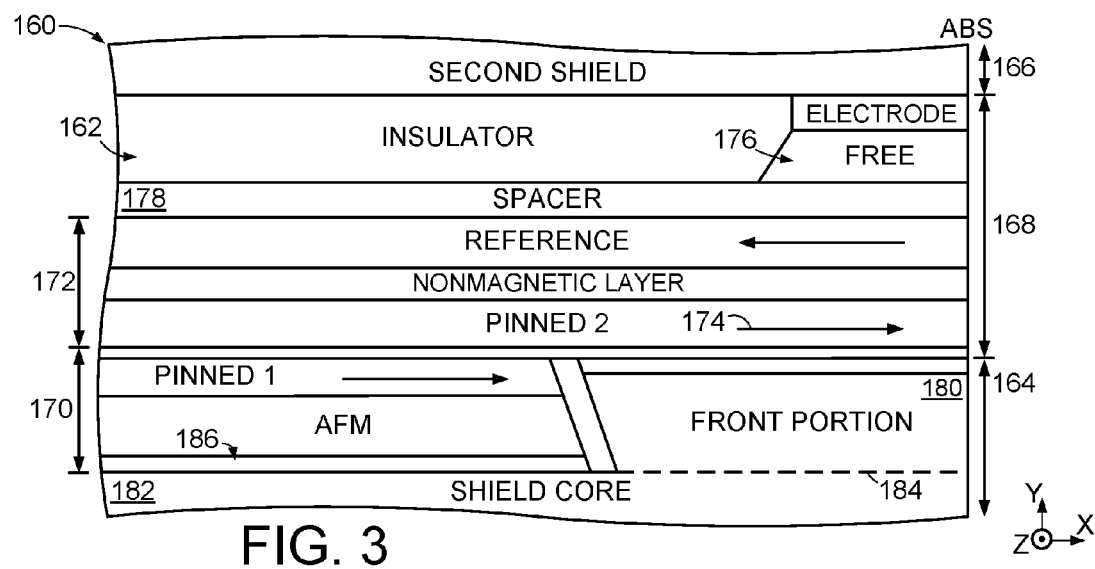
FIG. 3 shows a cross-section view line representation of a portion of an example data reader configured in accordance with some embodiments.

FIG. 3 shows a cross-section view line representation of a portion of an example data reader 160 arranged in accordance with assorted embodiments to increase magnetic performance despite a small SSS. The data reader 160 has a magnetoresistive (MR) stack 162 disposed between first 164 and second 166 shields that define the SSS 168. By recessing a fixed magnetization reference pinning structure 170 away from an air bearing surface (ABS), the reference structure 172 of the MR stack 162 can be set to a predetermined magnetization orientation 174 without adding to the SSS 168.

It is noted that the MR stack 162 is configured as a spin valve in FIG. 3 with a magnetically free layer 176 separated from the fixed magnetization reference structure 172 by a non-magnetic spacer layer 178, but such configuration is not required or limiting as lateral spin valve, trilayer, and abutted junction configurations may be utilized. The reference structure 172 is shown as a lamination of magnetic and non-magnetic layers, but various embodiments may configure the reference structure 172 as a single magnetic layer that is set to the predetermined magnetic orientation 174 by the fixed magnetization reference pinning structure 170.

By moving the fixed magnetization reference pinning structure 170 away from the ABS, the SSS 168 is reduced, but the front shield portion 180 of the second shield 166 is vulnerable to unpredictable magnetic volatility. The lateral alignment of the fixed magnetization reference pinning structure 170 and the front shield portion 180 along the X axis can restrict the physical connection of the front shield portion 180 with the shield core 182, as indicated by segmented seam 184.

That is, construction of the front shield portion 180 atop the second shield core 182 can result in a partial or complete seam 184 that can inhibit coupling between the core 182 and front shield portion 180. For example, residual dielectric material from the seed layer 186 of the pinning structure 170 can be present along seam 184, which degrades coupling between the front shield 180 and core 182 portions of the first shield 164. Thus, recessing the fixed magnetization reference pinning structure 170 can decrease SSS 168 at the expense of increased magnetic and thermal volatility for the first shield 164.

Figure 4:
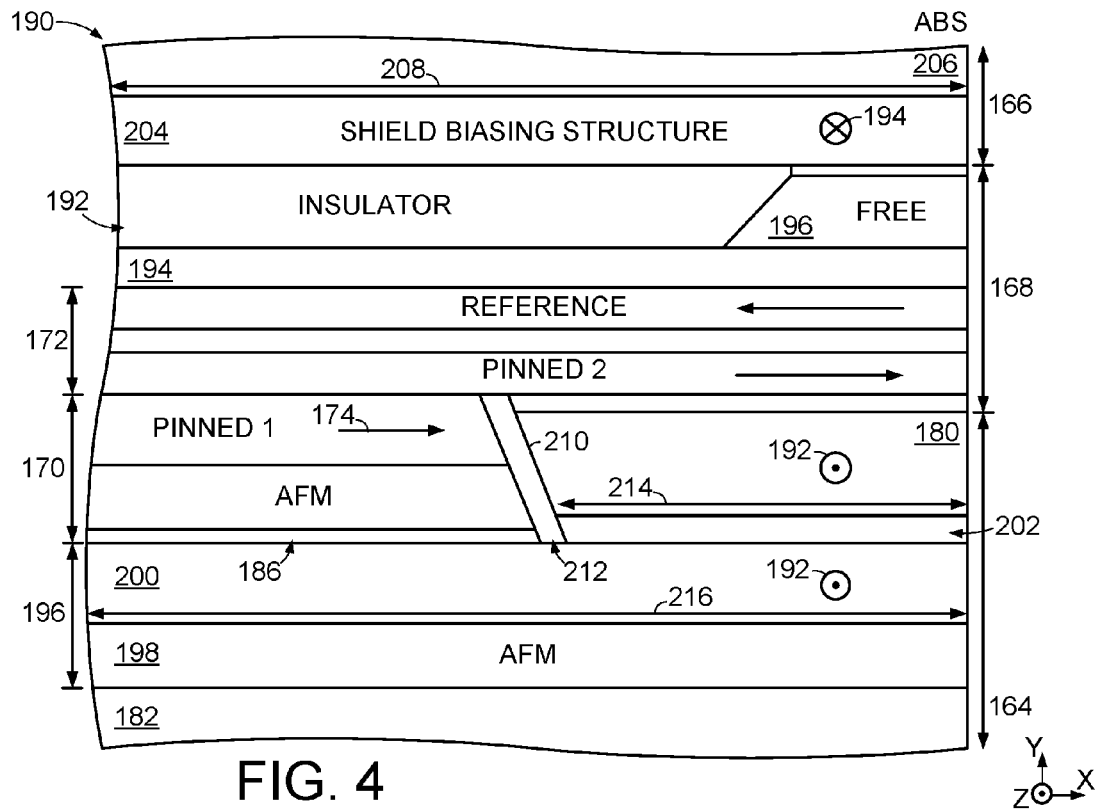
FIG. 4 illustrates a cross-section view line representation of a portion of an example data reader arranged in accordance with various embodiments.

FIG. 4 illustrates a cross-section view line representation of a portion of an example data reader 190 configured to mitigate magnetic and thermal volatility in the first shield 164 in accordance with some embodiments. The first shield 164 is configured with a fixed stabilizing magnetization 192 that can be the same, or different than the fixed magnetization 194 of the second shield 166. The fixed stabilizing magnetization 194 can be set by at least one high temperature annealing operation and maintained during operation by coupling the front shield portion 180 to the shield core 182 via a shield biasing structure 196. The shield biasing structure 196 is constructed with a pinning antiferromagnetic (AFM) layer 198 contacting a ferromagnetic layer 200 and setting the fixed stabilizing magnetization 192.

A shield coupling structure 202 is disposed between the front shield 180 and the shield biasing structure 196. The shield coupling structure 202 can be tuned for material, thickness along the Y axis, and position to maintain the stabilizing magnetization 192 strength and orientation relative to the ABS. The shield coupling structure 202 can be a single layer of magnetic material, such as CoFe with a range of compositions like 30% Co by weight, a single layer of non-magnetic material, such as Ru, or a lamination of magnetic and non-magnetic materials, such as a CoFe/Ru/CoFe configuration. The ability to tune the shield coupling structure 202 increases the reliability and strength of coupling with the shield biasing structure 196.

As shown, the second shield 166 consists of a shield biasing structure 204 that contacts and is coupled to a shield core 206 with a stripe height 208 extending from the ABS. The shield biasing structure 204 can be a single magnetic layer or a lamination of layers, such as a synthetic antiferromagnet (SAF), that has the set stabilizing magnetization 194 that may be set via one or more high temperature annealing operations.

Construction of the shield coupling structure 202 mitigates the presence of any residual pinning structure seed layer 186 material. It is contemplated that some, or all, of the shield coupling structure 202 extends from the ABS to separate the front shield portion 180 from the pinning 170 and shield biasing 196 structures with a front surface 210 canted at a non-normal angle with respect to the ABS. However, such configuration is not required or limiting as a separate dielectric buffer layer 212 can be positioned between the pinning structure 170 and the front shield portion 180. It is noted that the front shield portion 180 has a reduced stripe height 214 compared to the stripe heights 208 and 216 of the shield cores 182/206 and biasing structure 196, respectively.

In some embodiments, the shield coupling structure 202 is configured to provide ferromagnetic coupling while other embodiments arrange the coupling structure 202 to maintain antiferromagnetic coupling between the front shield portion 180 and the biasing structure 196. The biasing structure 196 may concurrently set the second shield core 182 to the fixed stabilizing magnetization 192 oriented parallel to the magnetization of the front shield portion 180, perpendicular to the ABS, as dictated by one or more annealing operations. A non-limiting example configures the shield coupling structure 2082 as a single layer of magnetic material, such as CoFe or NiFe, that continuously extends from the ABS to the buffer layer 212 to provide an interface between the front shield portion 180 and the biasing structure 196 conducive to maintaining ferromagnetic coupling strength and orientation.

Figure 5:
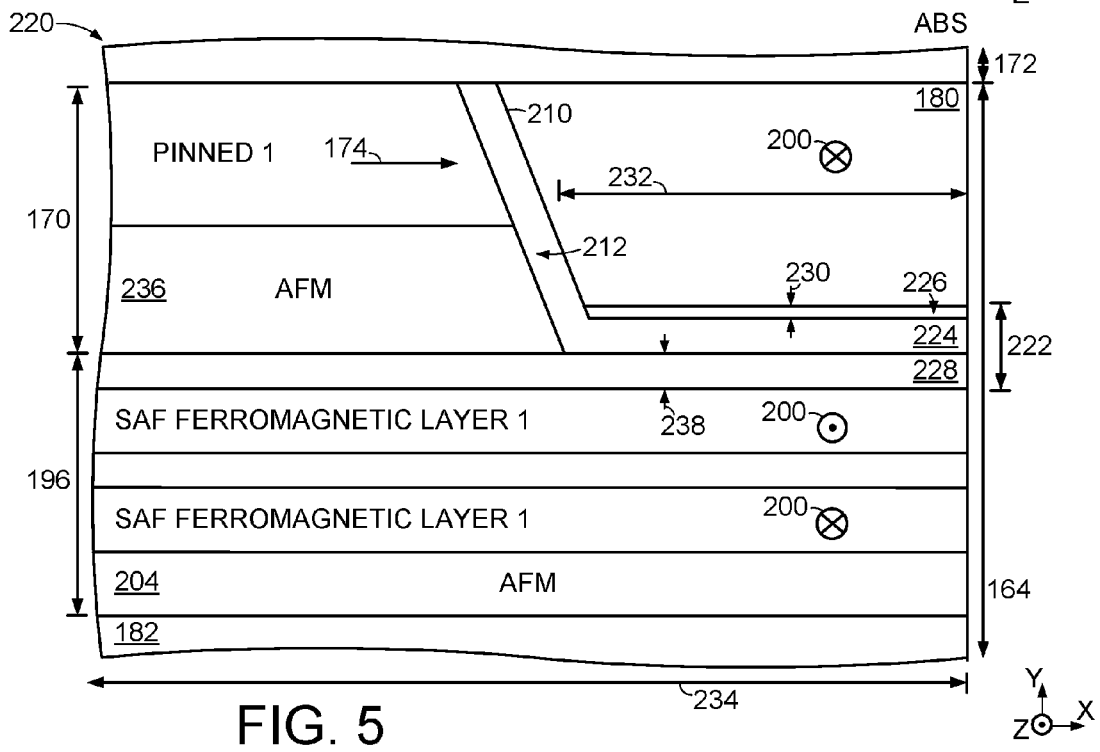
FIG. 5 depicts a cross-section view line representation of a portion of an example data reader configured in accordance with some embodiments.

FIG. 5 displays a cross-section line representation of a portion of an example data reader 220 arranged with a coupling structure 222 configured in accordance with various embodiments to maintain antiferromagnetic coupling between the front shield portion 180 and the biasing structure 196. The coupling structure 222 has a non-magnetic layer 224 disposed between first 226 and second 228 magnetic layers. The non-magnetic layer 224 can be a diverse variety of materials, such as a transition metal, that continuously extends from the ABS around the front shield portion 180 to the front surface 210 to form the buffer layer 212, as shown.

The respective stabilizing magnetic layers 226 and 228 can be tuned to be similar or dissimilar materials, sizes, and thicknesses along the Y axis to ensure antiferromagnetic coupling and the maintenance of the fixed magnetization 200 strength and orientation in the front shield portion 180. In the non-limiting embodiment shown in FIG. 5, the first magnetic layer 226 has a different thickness 230 and stripe height 232 than the second magnetic layer 228.

The ability to tune the respective magnetic layers 226 and 228 to have larger or smaller thicknesses and stripe heights allows the coupling structure 222 to be more efficiently constructed and the antiferromagnetic coupling between the front shield portion 180 and the biasing structure 196 to be controlled so as not to degrade in response to encountered stray magnetic fields. It is further contemplated that the coupling structure layers are tuned to provide coupling that does not affect the fixed magnetization 174 of the pinning structure 170.

The second magnetic layer 228, as shown, has a stripe height 234 that continuously extends from the ABS to contact the pinning structure 170 and serve as a seed layer for the pinning layer 236 of the pinning structure 170 while magnetically separating the biasing structure 196 from the pinning layer 236. It is noted that the tuned stripe height 234 and thickness 238 configuration of the second magnetic layer 228 can be selected with respect to the size and shape of the non-magnetic layer 224 to prevent ferromagnetic coupling and maintain antiferromagnetic coupling between the front shield portion 180 and the biasing structure 196.

It is noted that the non-magnetic layer 224 can continuously extend from the ABS up to the buffer layer 212. Various embodiments configure the non-magnetic layer 224 to continuously wrap around the front shield portion 180 to form the buffer layer 212 and define the front surface 210. Such wrap around non-magnetic layer 224 configuration can have one or more contacting sub-layers that are similar, or dissimilar, non-magnetic materials, such as alumina or a transition metal.

Figure 6:
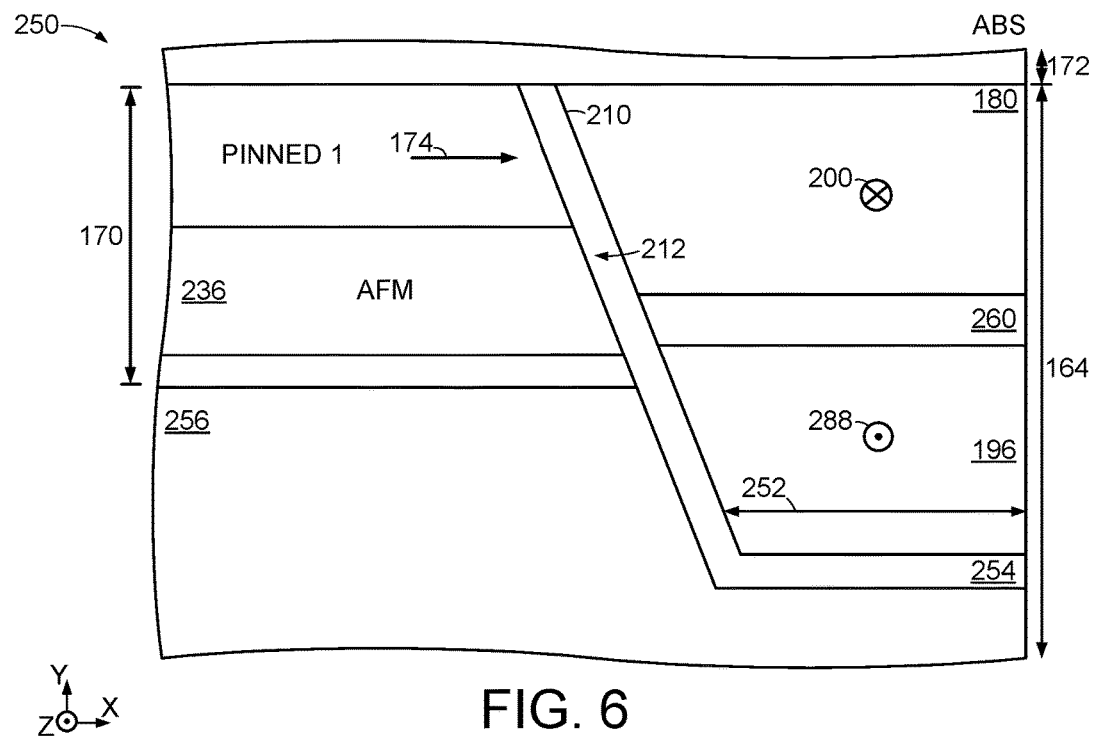
FIG. 6 is a cross-section view line representation of a portion of an example data reader arranged in accordance with assorted embodiments.

FIG. 6 illustrates a cross-sectional line representation of a portion of an example data reader 250 arranged in accordance with assorted embodiments to mitigate magnetic volatility in a front shield portion 180 of a shield 164. As displayed, the coupling structure 196 has been positioned proximal the ABS with a truncated stripe height 252 compared to the embodiment shown in FIG. 5. The shorter stripe height 252 allows the first coupling structure 254 to continuously extend from the ABS to separate the front shield portion 180 and biasing structure 196 from the shield core 256 as well as the pinning structure 170 while defining the front surface 210.

It is contemplated that the shortening of the biasing structure's stripe height 252 can localize the biasing magnetization to the ABS and decrease the risk of magnetic volatility in the pinning structure 170. Positioning the biasing structure 196 proximal the ABS also allows the first coupling structure 254 to be tuned to provide predetermined coupling with the shield core 256. In other words, the first coupling structure 254 can be a single layer of magnetic or non-magnetic material, in some embodiments, or a lamination of magnetic and non-magnetic layers in other embodiments to control how magnetization 258 from the biasing structure 196 affects the shield core 256.

A second coupling structure 260 may complement the first coupling structure 254 by providing ferromagnetic or antiferromagnetic coupling with the front shield portion 180. For example, the second coupling structure 260 can be arranged with similar, or dissimilar, numbers of constituent layers, materials, thicknesses, and stripe heights than the first coupling structure 254 to maintain the fixed front shield magnetization 200 despite encountering stray magnetic fields and various data bit magnetizations during operation.

The capability of tuning the shape and size of the biasing structure 196 along with the first 254 and second 260 coupling structures allows the data reader 250 to have customized and independent fixed magnetizations in the front shield portion 180, pinning structure 170, and shield core 256, which can provide optimized data sensing performance while providing a reduced SSS 168. However, a tuned coupling structure is not limited to the embodiments shown in FIGS. 3-6.

Figure 7:
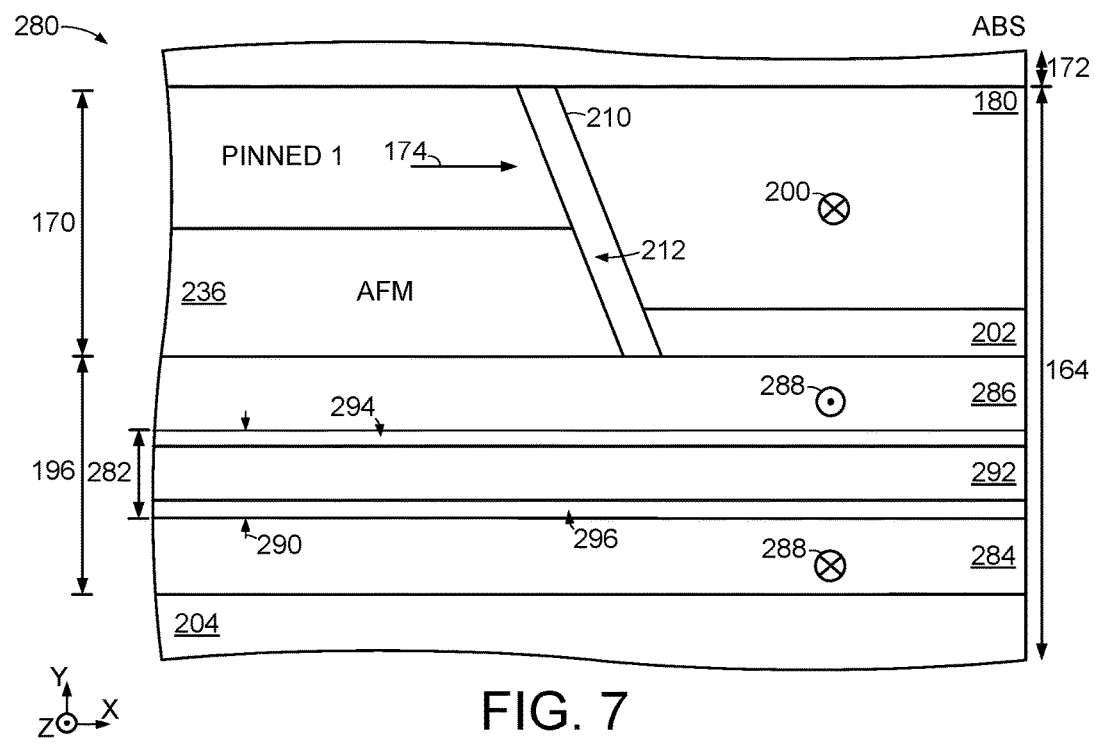
FIG. 7 shows a cross-section view line representation of a portion of an example data reader configured in accordance with some embodiments.

FIG. 7 depicts a cross-section line representation of a portion of an example data reader 280 that employs a bias coupling structure 282 in accordance with various embodiments to tune the magnetic coupling within a biasing structure 196. That is, when a biasing structure 196 is configured as a SAF, a bias coupling structure 282 can be positioned between first 284 and second 286 ferromagnetic layers to control the strength and orientation of fixed bias magnetizations 288. The bias coupling structure 282 can be a single layer of non-magnetic material, such as Ru, Ta, or Cr, that has a thickness 290 tuned to maintain the fixed bias magnetizations 288 in predetermined orientations, such as perpendicular to the ABS.

The bias coupling structure 282 shown in FIG. 7 in accordance with some embodiments is a lamination of a non-magnetic sub-layer 292 disposed between first 294 and second 296 magnetic sub-layers, such as CoFe or NiFe. Although not required or limiting, the bias coupling structure 282 can have a transition metal non-magnetic sub-layer 292 contacting a single magnetic sub-layer, such as CoFe. Regardless of the number of magnetic sub-layers 294/296, the thickness of the non-magnetic sub-layer 292 can be greater than each magnetic sub-layer 294/296 to tune the coupling strength between the ferromagnetic layers 284 and 286 while maintaining antiferromagnetic coupling instead of exchange coupling, as indicated by the opposite magnetic orientations of the respective ferromagnetic layers 284 and 286.

The ability to tune the coupling characteristics in a SAF biasing structure 202 can be employed alone or in combination with one or more tuned coupling structures, such as 254 and 260, to provide sufficient coupling between magnetic materials in the shield 166 without degrading the fixed magnetization 174 of the pinning structure 170. As a result, a data reader can have multiple fixed magnetizations 174, 200, 258, and 288 that are concurrently maintained at different orientations via ferromagnetic and/or antiferromagnetic coupling without inducing magnetic volatility for the magnetoresistive stack 132 or shield 164.

It is noted that while various embodiments are directed to positioning the front shield portion 180, biasing structure 202, and coupling structure(s) 208, 222, 254, and 260 below the magnetoresistive stack 132, such arrangement is not required. For instance, one or more biasing and stabilizing structures can be employed in a shield positioned downtrack from the magnetoresistive stack 132. Hence, the use of the assorted aspects of the shield 164 is not limited to an uptrack position and can be employed in any shield about a data reader or a data writer.

Figure 8:
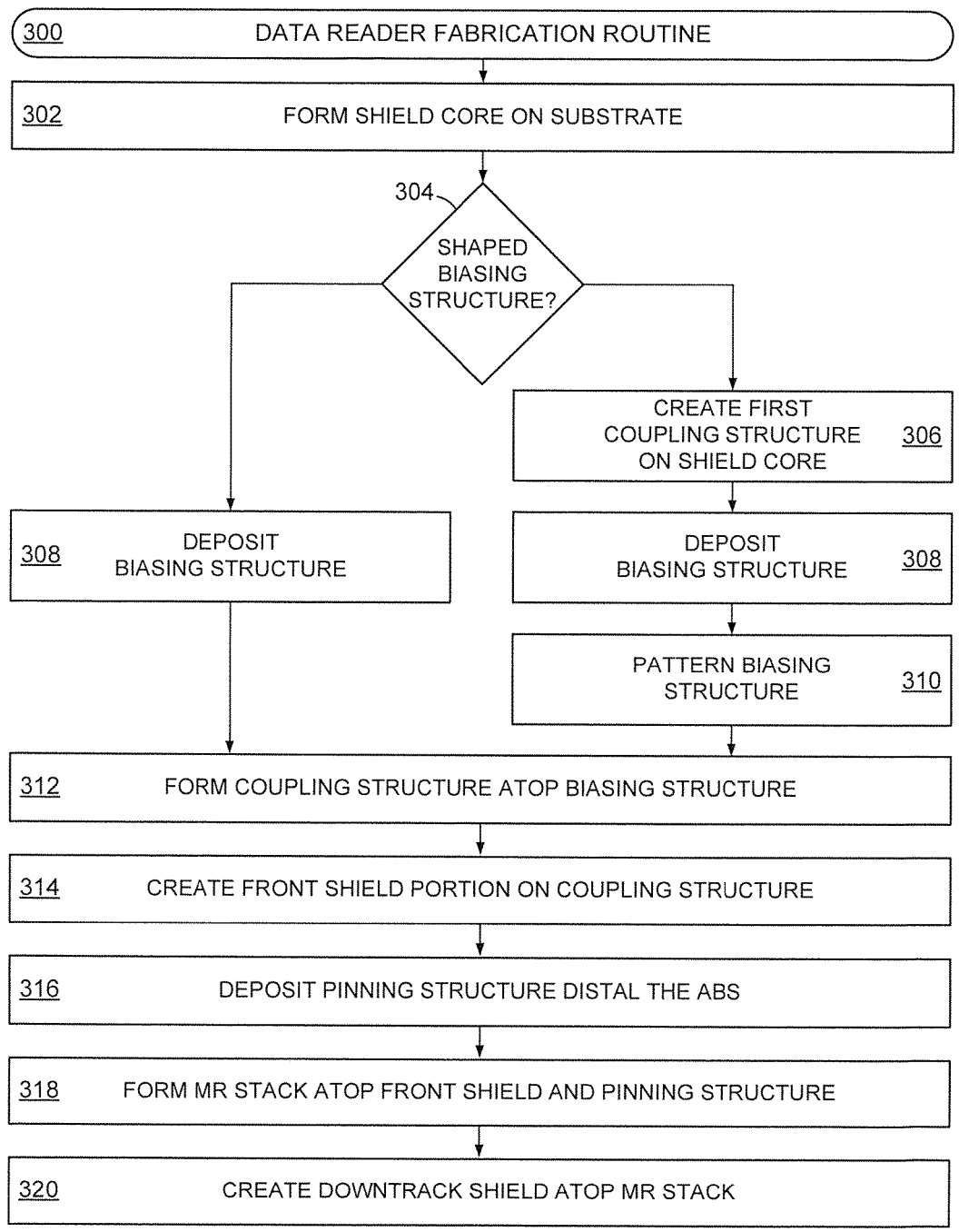
FIG. 8 plots an example data reader fabrication routine that may be carried out in accordance with various embodiments.

FIG. 8 provides a flowchart of an example data reader fabrication routine 300 that may be carried out in accordance with some embodiments. Initially, a shield core is formed on a substrate in step 302. The shield core can be magnetic and can be shaped with a varying thickness to provide a notch on the ABS. Design decision 304 determines if a biasing structure is to be shaped to be localized to the ABS, as illustrated by data reader 250. Decision 304 is not dependent on any process outcome of earlier steps of routine 300.

If a shaped biasing structure is chosen, step 306 creates a first coupling structure on the shield core, such as coupling structure 254, which may consist of one or more layers of magnetic or non-magnetic material to provide ferromagnetic or antiferromagnetic coupling between the shield core and a biasing structure deposited in step 308.

It is noted that step 308 is executed even when decision 304 chooses not to shape the biasing structure. However, the biasing structure of step 308 when the biasing structure is not shaped will have a greater stripe height than when step 308 is executed after step 306. The biasing structure can be configured as a SAF, as shown in data reader 220, or as a pinning lamination, as shown in data reader 190. With the biasing structure constructed, step 310 patterns the biasing structure by removing portions that are distal to the ABS, which may be subsequently followed by formation of a buffer layer or a buffer portion of the first coupling structure.

Atop the biasing structure, a coupling structure is formed in step 312. The coupling structure can be a single non-magnetic layer or a combination of magnetic and non-magnetic sub-layers to maintain either ferromagnetic or antiferromagnetic coupling between the biasing structure and a front shield portion created in step 314. In some embodiments, the constituent layers of the coupling structure are tuned to be different thicknesses, stripe heights, and/or materials to control the reliability and strength of coupling. The tuning of the coupling can reduce magnetic volatility in the shield without affecting the reference pinning magnetization provided by the pinning structure deposited in step 316.

The position of the pinning structure can be tuned to be aligned with the front shield portion created in step 314, which reduces the SSS of the magnetoresistive (MR) stack formed in step 318. Routine 300 then creates a downtrack shield atop the MR stack in step 320, which can be any number of layers, materials, and fixed magnetizations. It is noted that the various steps of routine 300 may consist of the deposition and removal of portions of several different materials and layers. For example, formation of the coupling structures in step 306 and 312 can involve successive deposition of non-magnetic and magnetic materials. As such, the various steps and decision of routine 300 are not required or limiting as any portion can be changed or removed just as any step or decision can be inserted.

Through the incorporation of one or more coupling structures into a data reader with a recessed pinning structure, fixed magnetizations in at least one shield are reliably maintained via tuned coupling. The ability to tune a coupling structure for the number of constituent layers, materials, and thicknesses allows a front shield portion to couple to a shield biasing structure to maintain a fixed shield magnetization in a predetermined direction regardless of encountered stray magnetic fields and operation of an adjacent magnetoresistive stack. The coupling in a shield can be selected to be ferromagnetic or antiferromagnetic, which provides diverse shield configurations that can be tuned to be conducive to a wide variety of data densities and magnetoresistive stack arrangements.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetoresistive stack contacting a shield on an air bearing surface (ABS) and contacting a pinning structure, a front shield separating the pinning structure from the ABS, the front shield separated from the pinning structure by a buffer layer canted at a non-normal angle with respect to the ABS.

2. The apparatus of claim 1, wherein the buffer layer comprises a dielectric material.

3. The apparatus of claim 1, wherein the buffer layer contacts a pinned layer of the pinning structure, an antiferromagnetic layer of the pinning structure, a seed layer of the pinning structure, a front shield layer, and stabilizing magnetic layer.

4. The apparatus of claim 1, wherein the front shield is separated from a shield biasing structure by the buffer layer.

5. The apparatus of claim 1, wherein the front shield continuously extends from the ABS to the buffer layer.

6. The apparatus of claim 1, wherein the front shield has a varying stripe height measured from the ABS as defined by the buffer layer.

7. The apparatus of claim 1, wherein the front shield has a magnetization oriented orthogonal to a magnetization of the pinning structure.

8. The apparatus of claim 1, wherein the buffer layer comprises a non-ferromagnetic transition metal material.

9. The apparatus of claim 1, wherein the pinning structure, buffer layer, and front shield are laterally aligned with each having a common extent as measured parallel to the ABS.

10. The apparatus of claim 1, wherein the front shield has a magnetization oriented orthogonal to a magnetization of a reference structure of the magnetoresistive stack.

11. An apparatus comprising a magnetoresistive stack contacting a shield on an air bearing surface (ABS) and contacting a pinning structure, a front shield separating the pinning structure from the ABS, the front shield separated from the pinning structure by a buffer layer continuously extending perpendicular to the ABS to a contact a front surface of the front shield, the buffer layer and front surface each canted at a non-normal angle with respect to the ABS.

12. The apparatus of claim 11, wherein the buffer layer surrounds two different sides of the front shield.

13. The apparatus of claim 11, wherein the buffer layer contacts a magnetic layer that continuously extends from the ABS to contact the front shield and pinning structure.

14. The apparatus of claim 11, wherein the front shield is separated from a synthetic antiferromagnet (SAF) by the buffer layer on the ABS.

15. The apparatus of claim 11, wherein a magnetic layer is disposed between and contacts the front shield and the buffer layer on the ABS.

16. The apparatus of claim 11, wherein the buffer layer extends perpendicularly from the ABS to the non-normal angle.

17. A data reader comprising a magnetoresistive stack contacting a shield on an air bearing surface (ABS) and contacting a pinning structure, a front shield separating the pinning structure from the ABS, the front shield separated from the pinning structure by a buffer layer canted at a non-normal angle with respect to the ABS, the buffer layer separated from the ABS and contacting a reference structure of the magnetoresistive stack.

18. The data reader of claim 17, wherein the buffer layer has a uniform thickness as measured perpendicular to the ABS.

19. The data reader of claim 17, wherein, the buffer layer is oriented at an angle of greater than 0 and less than 90° with respect to the ABS.

20. The data reader of claim 19, wherein the buffer layer maintains the angle from biasing structure of a shield to the reference structure.

\* \* \* \* \*

UNITED STATES PATENT AND TRADEMARK OFFICE
CERTIFICATE OF CORRECTION

PATENT NO. : 10,186,285 B2
APPLICATION NO. : 15/492638
DATED : January 22, 2019
INVENTOR(S) : Adam Lapicki et al.

It is certified that error appears in the above-identified patent and that said Letters Patent is hereby corrected as shown below:

In the Claims

In Column 8, Line 51, Claim 11:
"to a contact a front" should be "to contact a front"

Signed and Sealed this
Nineteenth Day of March, 2019

Andrei Iancu
*Director of the United States Patent and Trademark Office*